(12) United States Patent
Joshi et al.

(10) Patent No.: US 11,664,068 B2
(45) Date of Patent: May 30, 2023

(54) SINGLE ENDED CURRENT MODE SENSE AMPLIFIER WITH FEEDBACK INVERTER

(71) Applicant: International Business Machines Corporation, Armonk, NY (US)

(72) Inventors: Rajiv Joshi, Yorktown Heights, NY (US); Sudipto Chakraborty, Plano, TX (US); Alexander Fritsch, Esslingen (DE); Holger Wetter, Weil im Schoenbuch (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/367,455

(22) Filed: Jul. 5, 2021

(65) Prior Publication Data

US 2023/0005521 A1  Jan. 5, 2023

(51) Int. Cl.

| G11C 7/12 | (2006.01) |
|---|---|
| G11C 11/4091 | (2006.01) |
| G11C 11/4096 | (2006.01) |
| G11C 11/4074 | (2006.01) |
| G11C 11/4094 | (2006.01) |
| G11C 11/419 | (2006.01) |
| G11C 11/413 | (2006.01) |

(52) U.S. Cl.
CPC ...... *G11C 11/4091* (2013.01); *G11C 11/4074* (2013.01); *G11C 11/4094* (2013.01); *G11C 11/4096* (2013.01); *G11C 11/413* (2013.01); *G11C 11/419* (2013.01)

(58) Field of Classification Search
CPC ............ G11C 11/4091; G11C 11/4074; G11C 11/413; G11C 11/419
See application file for complete search history.

(56) References Cited

U.S. PATENT DOCUMENTS

| 4,982,363 A | 1/1991 | Sood |
|---|---|---|
| 5,426,385 A | 6/1995 | Lai |
| 5,796,284 A | 8/1998 | Clemen et al. |

(Continued)

OTHER PUBLICATIONS

Zhang et al., "A 1.2V 10UA Single-Ended Low Power Compact Sense Amp for High Density Low Voltage Flash Memories", Jun. 1, 1999, pp. 1-6, ip.com.

(Continued)

*Primary Examiner* — Mushfique Siddique
(74) *Attorney, Agent, or Firm* — Scully, Scott, Murphy & Presser, PC; Daniel P. Morris, Esq.

(57) ABSTRACT

A singled ended current sense amplifier circuit including an input stage having a bitline node, a sense node and a feedback circuit comprising a feedback inverter configured to provide an amplified voltage from the bitline node. The feedback inverter may include first and second NMOS transistors serially connected to a feedback node and first and second PMOS transistors serially connected to the feedback node. The feedback circuit may include a third NMOS transistor having a gate terminal connected to the feedback node and a drain terminal connected to the sense node. The input stage may include a third PMOS transistor operating as a current source to generate a sense current which flows in a current sensing path between the sense node and the bitline node. The input stage may act as a regulator to keep the voltage at the bitline node constant.

17 Claims, 8 Drawing Sheets

(56) References Cited

U.S. PATENT DOCUMENTS

| | | | |
|---|---|---|---|
| 7,126,869 B1* | 10/2006 | Chou | G11C 7/067 |
| | | | 365/207 |
| 8,699,275 B1 | 4/2014 | Raghavan | |
| 9,224,437 B2* | 12/2015 | Barth, Jr. | G11C 11/4091 |
| 9,444,408 B2* | 9/2016 | Bedarida | G11C 7/12 |
| 9,589,604 B1* | 3/2017 | Fritsch | G11C 29/026 |
| 10,043,578 B2 | 8/2018 | Lai et al. | |
| 2014/0040692 A1* | 2/2014 | Shah | G11C 29/021 |
| | | | 714/E11.167 |
| 2022/0230678 A1* | 7/2022 | Chakraborty | G11C 11/419 |

OTHER PUBLICATIONS

B. S. Reniwal, et al., "Robust, Ultra Fast Data Sensing Technique for Low Power Asymmetrical SRAM with Self-Shut-Off Feature", 2013, pp. 77-82,2013 IEEE Asia Pacific Conference on Postgraduate Research in Microelectronics and Electronics (PrimeAsia), Visakhapatnam.
Relates to U.S. Appl. No. 17/149,915, filed Jan. 15, 2021.

* cited by examiner

SINGLE ENDED CURRENT MODE SENSE AMPLIFIER WITH FEEDBACK INVERTER

BACKGROUND

This disclosure relates generally to current sense amplifier circuits, memory devices and systems which implement current sense amplifier circuits, and methods for configuring current sense amplifier circuits to read logic states of memory cells.

In a semiconductor memory device such as a dynamic random-access memory (DRAM) device or a static random-access memory (SRAM) device, data read operations are performed using sense amplifier circuits that are connected to bitlines of a memory array. The sense amplifier circuitry operates to sense or otherwise detect the stored data which is read from selected memory cells. The type and design of the sense amplifier circuitry which is implemented for a given memory device defines the robustness of bitline sensing, and strongly impacts performance metrics such as memory access time and overall power consumption/dissipation of the memory device. Recent trends have seen an increase in integration density of semiconductor memory devices and a reduction of operating voltages. An increase in memory density results in an increase in bitline capacitance which results in reduced memory speed (e.g., reduced memory access times) and increased power consumption.

Next generation sense amplifiers require single ended input. Single ended sense amplifiers are desirable as they lead to a simple top level interface to the READ/WRITE logic. Traditional differential sense amplifier circuits use latches, which consumes larger area and power, and skews requirements.

SUMMARY OF THE INVENTION

Embodiments of the disclosure include singled ended current sense amplifier circuits, and memory devices and systems which implement single ended current sense amplifier circuits to perform memory read operations. An exemplary embodiment includes a sense amplifier circuit which comprises a bitline node; a sense node; and a feedback circuit comprising a feedback inverter configured to provide an amplified voltage from the bitline node. In one embodiment, the feedback inverter may include first and second NMOS transistors serially connected to a feedback node and first and second PMOS transistors serially connected to the feedback node. In one embodiment, the feedback circuit may include a third NMOS transistor having a gate terminal connected to the feedback node and a drain terminal connected to the sense node.

In one embodiment, the feedback circuit may include a third PMOS transistor having a gate terminal connected to a bias signal a source terminal connected to VDD and a drain terminal connected to the sense node and a fourth PMOS transistor having a gate terminal connected to sense node and a drain terminal connected to the bitline node and being configured to provide a current sensing path of the feedback circuit. In one embodiment, the fourth PMOS transistor is a common source amplifier configured to drive gate terminals of a plurality of stacked NMOS transistors configured to set the bitline bias voltage. In one embodiment, the feedback circuit may include a fourth NMOS transistor having a drain terminal connected to the feedback node and gate terminal serving as a first standby pin, fifth and sixth NMOS transistors serially connected between the bitline node and VSS, wherein the gate terminal of the sixth transistor serves as a second standby pin. In one embodiment, the feedback circuit may include a fifth PMOS transistor having a gate terminal connected to sense node and a drain terminal connected to the bitline node and is configured to provide another current sensing path of the feedback circuit. In one embodiment, the feedback circuit may include a seventh NMOS transistor having a drain terminal connected to the fourth PMOS transistor, wherein seventh NMOS transistor is configured to act as a current mirror and the fourth PMOS transistor drives the gate of the seventh NMOS transistor. In one embodiment, the sense amplifier circuit may include a bias generation circuit that may include a read bitline replica circuit, a current mirror circuit and/or a leakage monitor circuit and a plurality of stacked NMOS transistors.

Another exemplary embodiment includes a memory device which comprises an array of memory cells, first control lines extending in a first direction across the array of memory cells and second control lines extending in a second direction across the array of memory cells, wherein the second control lines comprise a plurality of bitlines, and control circuitry coupled to the first control lines and to the second control lines. The control circuitry comprises singled ended bitline current sense amplifier circuitry coupled to the plurality of bitlines, wherein the singled ended bitline current sense amplifier circuitry comprises a bitline node; a sense node; and a feedback circuit comprising a feedback inverter configured to provide an amplified voltage from the bitline node. In one embodiment, the feedback inverter may include first and second NMOS transistors serially connected to a feedback node and first and second PMOS transistors serially connected to the feedback node. In one embodiment, the feedback circuit may include a third NMOS transistor having a gate terminal connected to the feedback node and a drain terminal connected to the sense node.

Another exemplary embodiment includes a method, which comprises setting a constant voltage level of a read bitline of a current sense amplifier circuit of a memory device and detecting deviations of the voltage level of the read bitline and open or close a transistor in a feedback circuit to maintain the voltage constant, wherein the transistor connected between a bitline node and a current sense node of the current sense amplifier circuit. In one embodiment, the method may also include limiting the current provided by the transistor to the read bitline lower than a READ-1 current of an SRAM cell. In one embodiment, the method may also include compensating for bitline leakage by current supplied by the transistor operating in a triode mode during READ-0 operations of the memory device and switching the transistor from the triode mode to a saturated mode during READ-1 operations of the memory device.

Further features as well as the structure and operation of various embodiments are described in detail below with reference to the accompanying drawings. In the drawings, like reference numbers indicate identical or functionally similar elements.

DETAILED DESCRIPTION

Figure 1:
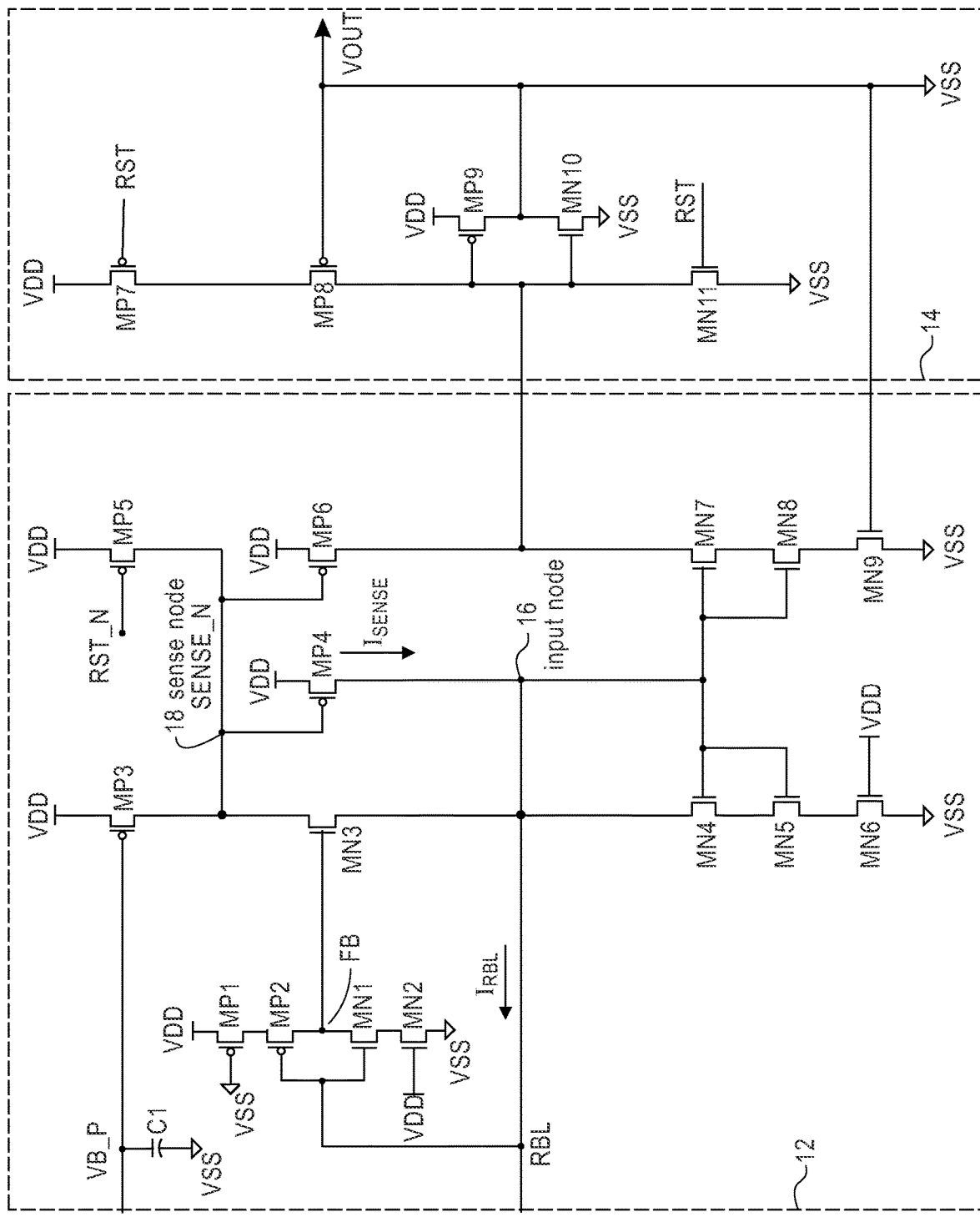
FIG. 1 schematically illustrates a single ended bitline current sense amplifier circuit, according to an exemplary embodiment of the disclosure.

FIG. 1 schematically illustrates a single ended current mode sense amplifier circuit 10 according to an exemplary embodiment of the disclosure. The current sense amplifier circuit 10 is powered by a positive supply voltage VDD and a negative supply voltage VSS. In some embodiments, VDD provides a supply power of about 1.0V or less (e.g., 0.85V), and VSS is connected to ground voltage (e.g., VSS=0V). The current sense amplifier circuit 10 comprises an input stage 12 and an output stage 14. The input stage 12 comprises PMOS transistors MP1, MP2, MP3, MP4, MP5 and MP6 and NMOS transistors MN1, MN2, MN3, MN4, MN5, MN6, MN7, MN8 and MN9. The output stage 14 comprises PMOS transistors MP7, MP8, and MP9, and NMOS transistors MN10 and MN11. The input stage 12 comprises an input node 16 (alternatively referred to as bitline node 16), and a sense node 18. The input node 16 is connected to a bitline RBL (e.g., a read bitline RBL of an SRAM array), wherein the bitline is connected to a plurality of memory cells in a given column of a memory array. The input node 16 comprises a low impedance node, and the sense node 18 comprises a high impedance node.

The input stage 12 of the single ended current mode sense amplifier 10 comprises a current sensing stage which is configured to sense a read current $I_{RBL}$ that flows from the input node 16 to the bitline RBL during a read operation and generate an analog voltage on the sense node 18 (alternatively referred to herein as sense voltage $V_{SENSE}$) based on a magnitude of the read current $I_{RBL}$. The magnitude of the read current $I_{RBL}$ (which is sunk to the bitline RBL) will vary depending on whether the memory cell which is being read comprises a logic "1" or a logic "0" data value.

In the input stage 12 of the single ended current mode sense amplifier 10, the PMOS transistor MP3 comprises a source terminal connected to the VDD, a drain terminal connected to the sense node 18, and a gate terminal connected to a VB_P bias voltage input node. The VB_P bias voltage input node is connected to VSS. The PMOS transistor MP5 comprises a source terminal connected to the VDD, a drain terminal connected to the sense node 18, and a gate terminal connected to an RST_N control input node. The PMOS transistor MP4 comprises a source terminal connected to the VDD, a drain terminal connected to the bitline node 16, and a gate terminal connected to the sense node 18. The PMOS transistor MP6 comprises a source terminal connected to the VDD, a drain terminal connected to VSS and a gate terminal connected to the sense node 18. Sense node 18 is connected to VSS.

In the input stage 12 of the single ended current mode sense amplifier 10, the PMOS transistor MP1 comprises a source terminal connected to the VDD, a drain terminal connected to the source terminal of PMOS transistor MP2, and a gate terminal connected to VSS. The PMOS transistor MP2 comprises a source terminal connected to the drain terminal of PMOS transistor MP1, a drain terminal connected to feedback node FB, and a gate terminal connected to bitline RBL. The NMOS transistor MN1 comprises a drain terminal connected to the feedback node FB, a source terminal connected to the drain terminal of the NMOS transistor MN2, and a gate terminal connected to bitline RBL. The NMOS transistor MN2 comprises a source terminal connected to VSS and a gate terminal connected to VDD. The NMOS transistor MN3 comprises a source terminal connected to input node 16, a drain terminal connected to drain terminal of PMOS transistor MP3 and a gate terminal connected to feedback terminal FB. Capacitor C1 is connected between VB_P and sense node 18. Capacitor C1 is a decoupling capacitor for VB_P.

In the input stage 12 of the single ended current mode sense amplifier 10, the NMOS transistor MN4 comprises a drain terminal connected to input node 16, a source terminal connected to the drain terminal of NMOS transistor MN5 and a gate terminal connected to input node 16. The NMOS transistor MN5 comprises a drain terminal connected to the source terminal of NMOS transistor MN4, a source terminal connected to the drain terminal of NMOS transistor MN6 and a gate terminal connected to input node 16. The NMOS transistor MN6 comprises a drain terminal connected to the source terminal of NMOS transistor MN5, a source terminal connected to VSS and a gate terminal connected to VDD. The NMOS transistor MN7 comprises a drain terminal connected to VSS, a source terminal connected to the drain terminal of NMOS transistor MN8 and a gate terminal connected to input node 16. The NMOS transistor MN8 comprises a drain terminal connected to the source terminal of NMOS transistor MN7, a source terminal connected to the drain terminal of NMOS transistor MN9 and a gate terminal connected to input node 16. The NMOS transistor MN9 comprises a drain terminal connected to the source terminal of NMOS transistor MN8, a source terminal connected to VSS and a gate terminal connected to VSS in output stage 14.

In the output stage 14 of the single ended current mode sense amplifier 10, the PMOS transistor MP7 comprises a source terminal connected to VDD, a drain terminal connected to VSS and a gate terminal connected to an RST control input node. The PMOS transistor MP8 comprises a source terminal connected to the drain terminal of PMOS transistor MP7, a drain terminal connected to VSS and a gate terminal connected to an output node VOUT. The PMOS transistor comprises a source terminal connected to VDD, a drain terminal connected to VSS and a gate terminal connected to VSS. The NMOS transistor MN10 comprises a drain terminal connected to VSS, a source terminal connected to VSS and a gate terminal connected to VSS. The NMOS transistor MN11 comprises a drain terminal connected to VSS, a source terminal connected to VSS and a gate terminal connected to an RST control input node.

In some embodiments, the single ended current mode sense amplifier circuit 10 is controlled using complementary control signals, denoted RST and RST_N (which are applied on the respective control input nodes RST and RST_N), and a DC bias voltage, denoted VB_P (which is applied to the bias voltage input node VB_P). The control signals RST and RST_N are generated to control reset operations of the current sense amplifier circuit 10. As shown in FIG. 1, the control signal RST is applied to the gate terminals of MP7 and MN11 in the output stage 14. The complementary control signal RST_N is applied to the gate terminals of MP5 in the input stage 12.

In some embodiments, during a power down and reset mode of operation (e.g., standby state or hold state) of the single ended current mode sense amplifier circuit 10, the control signal RST is asserted to logic "1", while the complementary control signal RST_N is asserted to logic "0". On the other hand, during an active mode of operation (e.g., read operation) of the single ended current mode sense amplifier circuit 10, the control signal RST is asserted to logic "0", while the complementary control signal RST_N is asserted to logic "1". It is to be understood that the terms "standby state" and "reset state" and "hold state" and "power down state" are alternatively used herein to refer to a non-read mode of operation of the single ended current mode sense amplifier circuit 10 in which various nodes are reset to target voltage levels, and various quiescent currents are turned OFF to reduce the power consumption.

In the input stage 12 of the single ended current mode sense amplifier 10, the PMOS transistor MP3 operates as a current source to generate a sense current $I_{SENSE}$ which flows in a current sensing path between the sense node 18 and the bitline node 16. The bias voltage VB_P (which is applied to the gate terminal of MP3) provides a bias voltage for setting a gate-to-source voltage ($V_{GS}$=(VB_P−VDD)) of the PMOS transistor MP3 to drive MP3 to an ON state, wherein MP3 operates a current source to generate the sense current $I_{SENSE}$ when the input stage 12 is in an active mode of operation (e.g., read mode). During a read operation, the magnitude of the sense current $I_{SENSE}$ will vary depending on whether a logic "0" or logic "1" is read from a memory cell connected to the bitline RBL that is connected to the bitline node 16. In the active mode MP3 is in triode mode (low impedance mode for read-0 (and idle phases) and in current source mode (saturated mode, high impedance mode) for read-1.

In the exemplary embodiment of FIG. 1, the header and footer transistors provide leakage control. PMOS transistor MP1 is a header device and NMOS transistors NM6 and MN9 are footer devices. In some embodiments, NMOS transistors MN5 and MN8 are gated diodes.

In the exemplary embodiment of FIG. 1, the transistors MN1, MN2, MN3, MP1, MP2 and MP4 comprise a feedback amplifier circuit which operates as a current-voltage controlled negative feedback system. In the exemplary feedback circuit configuration, the transistors MP1 and MP2 are serially connected to feedback node FB and the transistors MN1 and MN2 are also serially connected to the feedback node FB. Transistors MN3 and MP4 are connected between the bitline node 16 and the sense node 18, wherein the transistor MP4 comprises a current sensing path of the feedback circuit. In addition, the PMOS transistor MP4 operates as a common source amplifier which is controlled by the voltage on the sense node 18 to provide a feedback current path from the VDD to the bitline node 16 through the transistor MP4 when the transistor is turned ON. PMOS transistor MP4 drives the gates of stacked NMOS transistors MN4, MN5, and MN6.

In general, the function of the input stage can be seen as a regulator that wants to keep the voltage on RBL (node 16) constant. The level of the constant voltage is set by the feedback amplifier MP1,MP2,MN1,MN2 and MN3. In some embodiments, this voltage level will be close to 0.5× VDD. The feedback amplifier will detect deviations for that voltage and open or close MN3 as required to maintain the voltage level on RBL constant. At the same time this part of the circuit decreases the input impedance significantly compared to the prior art. This is the "inner" feedback loop of the input stage and one of the main features of the current mode sense amplifier. MP3 is configured to limit the current it can provide to the RBL to a certain value much lower than the READ-1 current of an SRAM cell. During idle phases or READ-0 operations, only the bitline leakage has to be compensated by the current mode sense amplifier to keep the RBL voltage constant. This current can be supplied by MP3 alone, the transistor will stay in triode mode, SENSE_N (node 18) will be close to VDD, MP4 and MP6 stay turned off. During READ-1 operations, the current that needs to be supplied to the RBL to keep the voltage level constant exceeds the drive capability of MP3. MP3 will switch from triode to saturated mode, its rds impedance will change from low to high. This is the main sensing mechanism. Consequently, the voltage on SENSE_N will drop until MP4 is turned on and will provide ($I_{READ1}$-$I_{MP3}$) to the bitline. The input stage will control MP4 by modulating SENSE_N as required to keep the RBL voltage level at 0.5× VDD against the read devices of an SRAM cell that wants to pull down RBL to VSS. This is the function of the "outer" feedback loop of the input stage. In other words, if the input stage calls MP4 for help, it is interpreted as a READ-1 operation by the sense amp. MP6 is connected to the same SENSE_N node as MP4. MP6 will also be turned on in this case and pull up the Q node (input of output inverter MP9/MN10) to VDD. MP4 and MP6 work in a current mirror configuration. This mechanism is how the information that a READ-1 was detected is transferred from the input stage to the output stage.

Figure 2:
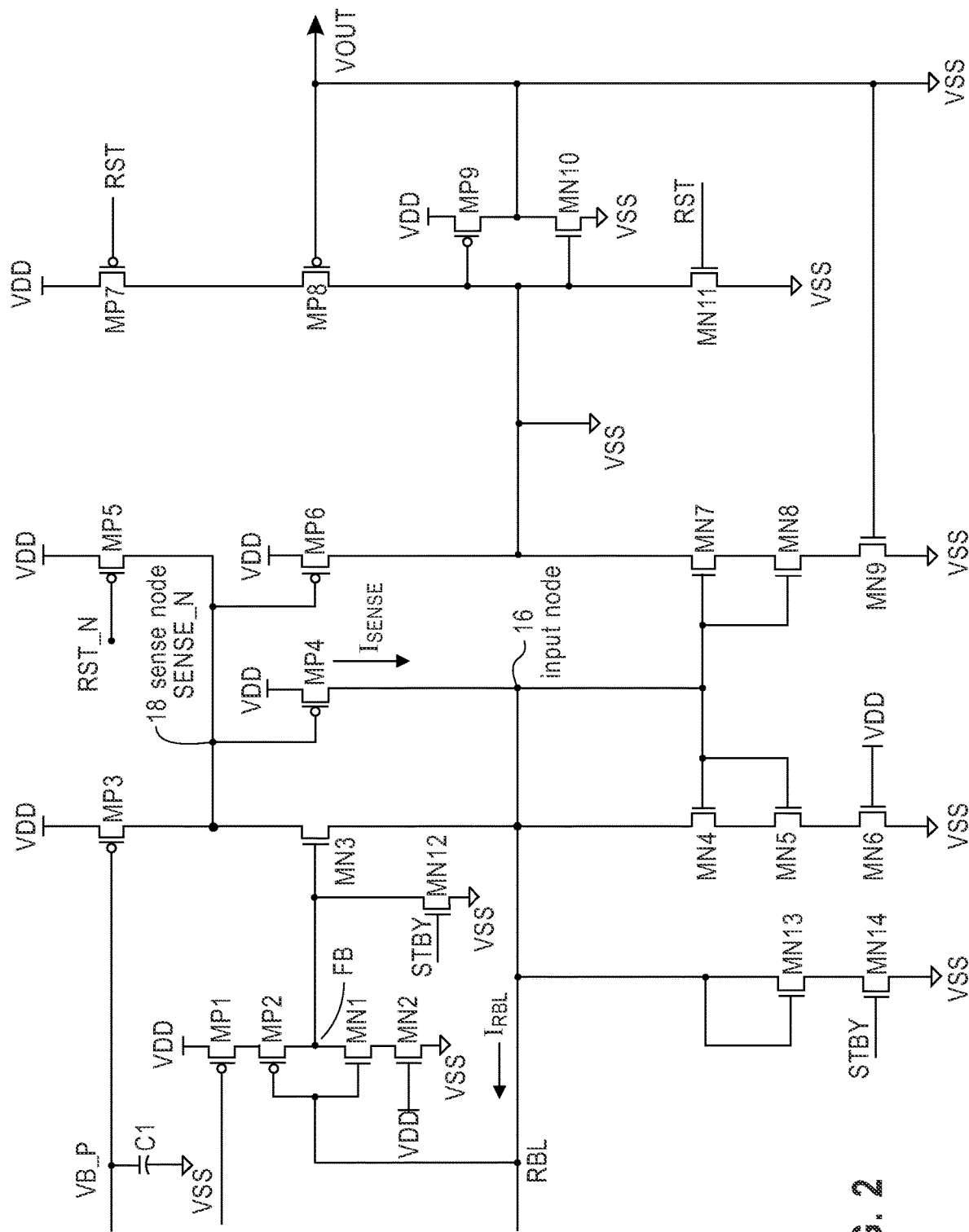
FIG. 2 schematically illustrates a single ended bitline current sense amplifier circuit, according to another exemplary embodiment of the disclosure.

FIG. 2 schematically illustrates a single ended current sense amplifier circuit, according to another exemplary embodiment of the disclosure. In particular, FIG. 2 schematically illustrates a single ended current sense amplifier circuit 20 which is similar the single ended current sense amplifier circuit 10 of FIG. 1, except that the single ended current sense amplifier circuit 20 has an input stage has additional NMOS transistors MN12, MN13 and MN14. NMOS transistor MN12 has drain terminal connected to feedback node FB, a source terminal connected to VSS and a gate terminal connected to standby signal STBY. NMOS transistor MN13 has drain terminal connected to bitline RBL, a source terminal connected to the drain terminal of NMOS transistor MN14 and a gate terminal connected to bitline RBL. NMOS transistor MN14 has drain terminal connected to the source terminal of NMOS transistor MN13, a source terminal connected to VSS and a gate terminal connected to standby signal STBY. This configuration of the feedback circuit does not change the current transfer function as compared to the configuration of the feedback circuit shown in FIG. 1. In the exemplary embodiment of FIG. 2, MNOS transistor MN14 is additional footer device and NMOS transistor MN13 is an additional gated diode device to provide additional leakage control.

Figure 3:
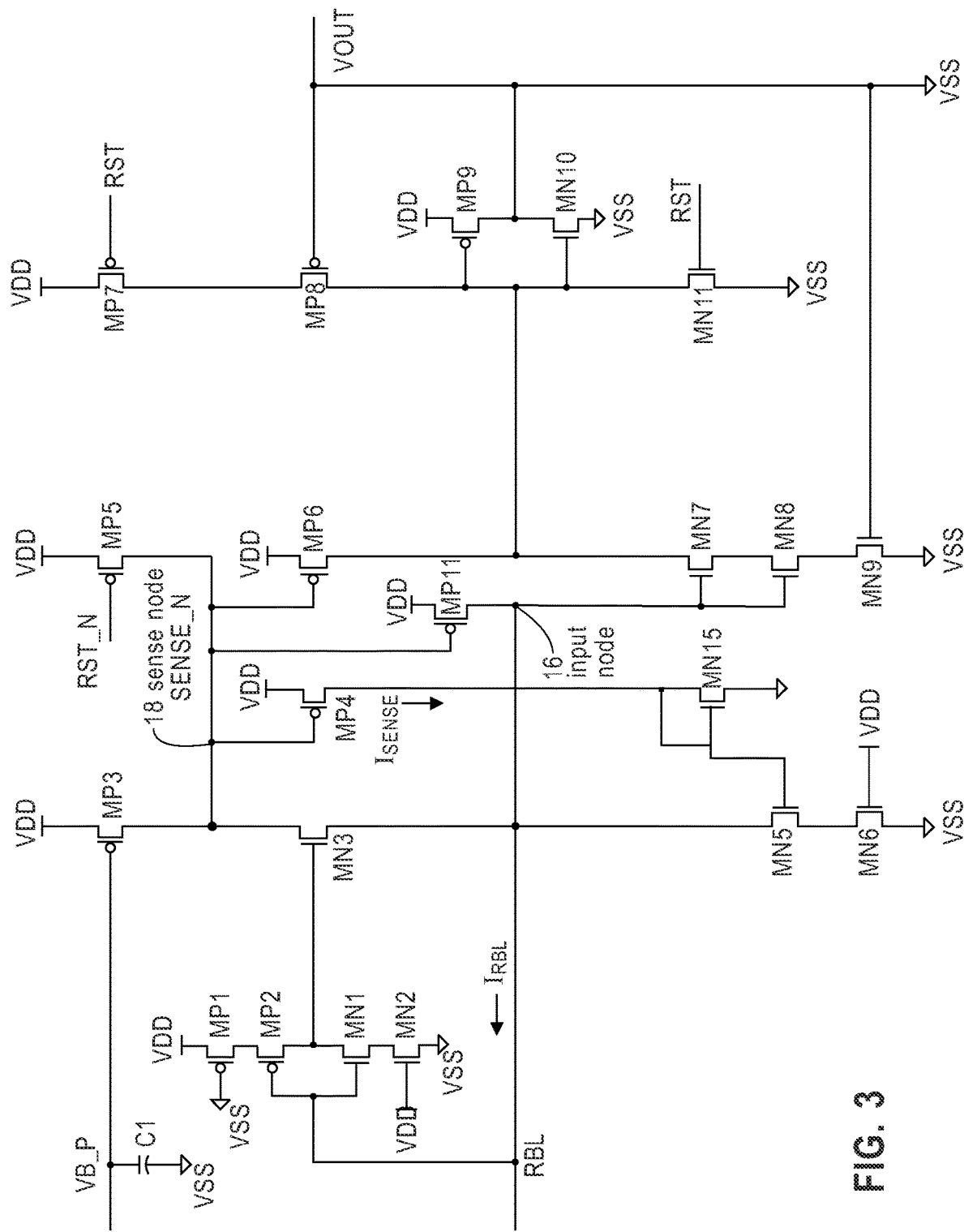
FIG. 3 schematically illustrates a single ended bitline current sense amplifier circuit, according to another exemplary embodiment of the disclosure.

FIG. 3 schematically illustrates a single ended current sense amplifier circuit, according to another exemplary embodiment of the disclosure. In particular, FIG. 3 schematically illustrates a single ended current sense amplifier circuit 22 which is similar the single ended current sense amplifier circuit 10 of FIG. 1, except that NMOS transistor MN4 is eliminated and NMOS transistor MN15 and PMOS transistor MP11 are added. NMOS transistor MN15 has a drain terminal connected to the drain terminal of PMOS transistor MP4, a source terminal connected to VSS and a gate terminal connected to the gate terminal of NMOS transistor MN5 and connected to the drain terminal of PMOS transistor MP4. PMOS transistor MP11 has a source terminal connected to VDD, a drain terminal connected to input node 16 of bitline RBL and a gate terminal connected to sense node 18. In one embodiment, the PMOS transistor MN11 feedback is separate and the PMOS transistor MP44 is driving the nfet MN15 acting as current mirror and driving gate of the nfet MN5 sensing bias current.

Figure 4:
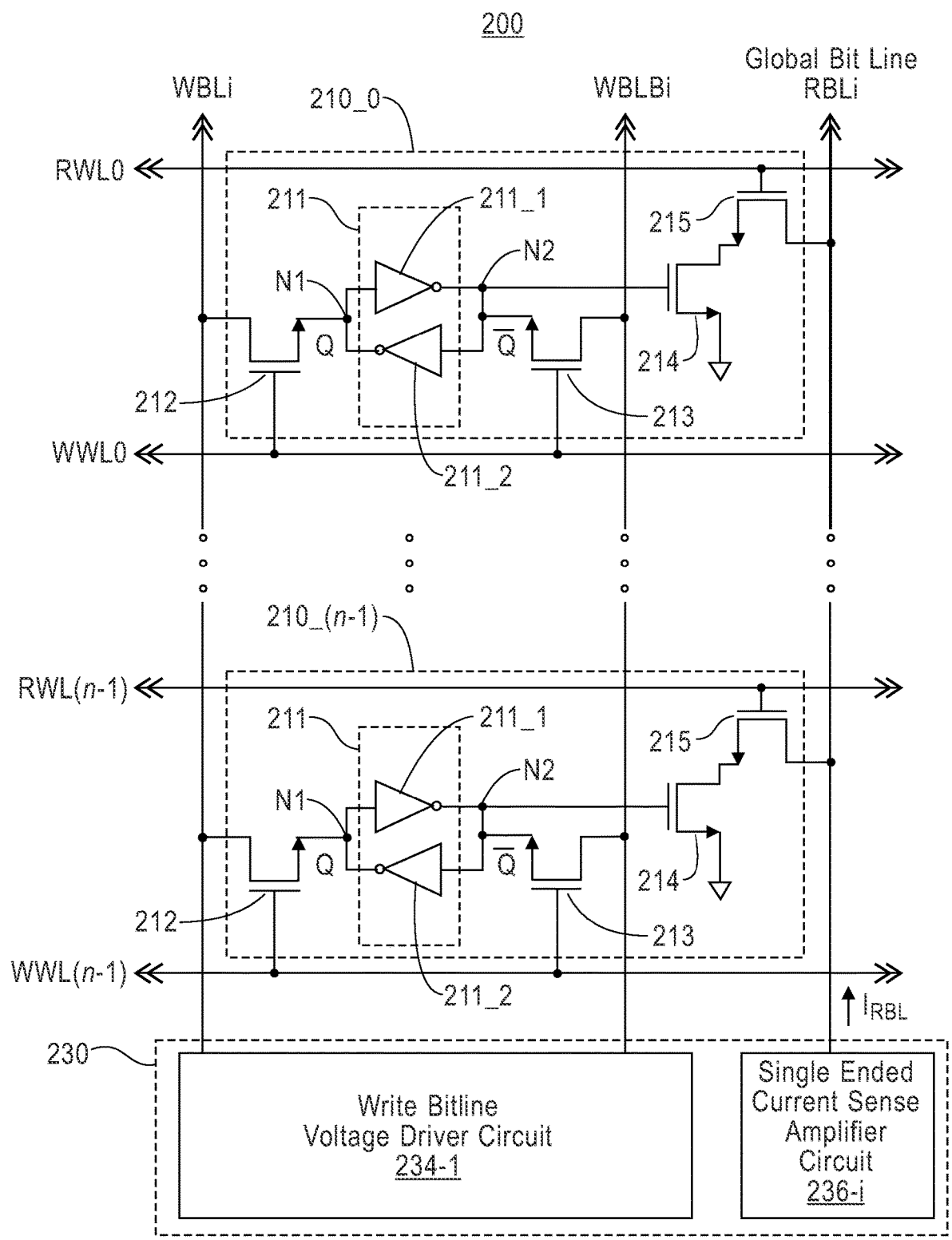
FIG. 4 schematically illustrates a memory device which implements single ended current sense amplifier circuitry, according to an exemplary embodiment of the disclosure.

FIG. 4 schematically illustrates a column architecture of a memory device which implements single ended current sense amplifier circuitry, according to an exemplary embodiment of the disclosure. In some embodiments, FIG. 4 schematically illustrates a column architecture of the memory device 200 in an exemplary embodiment where memory cells are implemented using an 8T SRAM memory cell architecture arranged in an n×m array of n rows (R0, R1, . . . , R(n-1)) and in columns (C0, C1, . . . , C(m-1)), wherein FIG. 4 represents a single column (e.g., $i^{th}$ column Ci) of the memory device 200, according to an exemplary embodiment of the disclosure. Other SRAM cells may also be used, such as 10T and 12T.

As shown in FIG. 4, the memory device 200 comprises a plurality (n) of 8T SRAM memory cells 210_0, . . . , 210_(n-1) (generally denoted 210). Each SRAM memory cell 210 comprises a storage element 211, first and second write access transistors 212 and 213, and first and second read access transistors 214 and 215, wherein the transistors 212, 213, 214, and 215 are NMOS transistors. The storage element 211 comprises a pair of cross-coupled inverters 211-1 and 211-2, a first storage node N1 which stores a logic value Q, and a second storage node N2 which stores a complementary logic value 0. In some embodiments, the logic value of Q (e.g., Q=1 or Q=0) represents the logic state of the memory cell 210, while the logic value of $\overline{Q}$ represents the complementary logic value of the memory cell 210. The SRAM memory cells 210 preserve their logic states as long as power is applied to the SRAM memory cells 210.

As further shown in FIG. 4, gate terminals of the first and second write access transistors 212 and 213 are coupled to the write wordline WWL for the given row. In addition, the first write access transistor 212 has a drain terminal coupled to the write bitline WBLi for the $i^{th}$ column, and a source terminal coupled to the first storage node N1 of the storage element 211. The second write access transistor 213 has a drain terminal coupled to the complementary write bitline WBLBi for the $i^{th}$ column, and a source terminal coupled to the second storage node N2 of the storage element 211. Further, the second read access transistor 215 has a gate terminal coupled to the read wordline RWL for the given row, a drain terminal coupled to the global read bitline RBLi for the $i^{th}$ column, and a source terminal coupled to a drain terminal of the first read access transistor 214. In addition, the first read access transistor 214 has a gate terminal coupled to the second storage node N2 of the storage element 211, and a source terminal connected to a ground rail (e.g., VSS=0).

The global read bitline RBLi for the $i^{th}$ column is connected to a single ended current sense amplifier circuit 236-I of control circuit 230. Control circuit 230 includes write bitline voltage driver circuit 234-i. In some embodiments, the single ended current sense amplifier circuit 236-i is implemented using the current sense amplifier circuit 10 of FIG. 1, the current sense amplifier circuit 20 of FIG. 2 or the current sense amplifier circuit 22 of FIG. 3. As noted above, in some embodiments, the single ended current sense amplifier circuitry 236-i comprises an individual current sense amplifier circuit block for each column (C0, C1, . . . , C(m-1)), wherein each individual current sense amplifier circuit block is connected to a respective read bitline RBL for the respective column. In addition, as shown in FIG. 4, the read bitline RBLi for the given $i^{th}$ column is coupled to the drain terminals of the second read access transistors 215 of all SRAM memory cells 210_0, . . . , 210_(n-1) in the given $i^{th}$ column. As further shown in FIG. 4, the write bitline WBLi for the $i^{th}$ column is coupled to the drain terminals of the first write access transistors 212 of all SRAM memory cells 210 in the $i^{th}$ column, and the complementary write bitline WBLBi for the $i^{th}$ column is coupled to the drain terminals of the second write access transistors 213 of all SRAM memory cells in the $i^{th}$ column. The complementary write bitline pair WBLi/WBLBi is coupled to a write bitline voltage driver circuit block 234-i for the $i^{th}$ column.

For illustration purposes, exemplary write and read operations will be discussed with regard to the SRAM memory cell 210_0 in row R0. Writing to the SRAM memory cell 210_0 is achieved by applying a logic "1" voltage level (e.g., VDD) onto one of the complementary write bitlines WBLi or WBLBi, while applying a logic "0" voltage level (e.g., VSS) on the other, and then driving the write wordline WWL0 to logic "1" to activate the first and second write access transistors 212 and 213 and allow the voltage levels held on the complementary write bitlines WBLi and WBLBi to overcome the current state of the storage element 211. For example, to write a logic "0" to the SRAM cell 210_0, a logic "0" voltage is applied to the write bitline WBLi, and a logic "1" voltage is applied to the complementary write bitline WBLBi. The write wordline WWL0 is then asserted, which causes the logic "0" value of the write bitline WBLi to be stored at the first storage node N1, and the complementary logic "1" value to be stored at the second storage node N2. Similarly, to write a logic "1" to the SRAM cell 210_0, a logic "1" voltage is applied to the write bitline WBLi, and a logic "0" voltage is applied to the complementary write bitline WBLBi. The write wordline WWL0 is then asserted, which causes the logic "1" value of the write bitline WBLi to be stored at the first storage node N1, and the complementary logic "0" value to be stored at the second storage node N2.

When performing a read operation using the single ended current sense amplifier circuit 236-i, the memory cell 32 stores a logic "1" value, wherein Q=1 at node N1, and $\overline{Q}$=0 at node N2 of the SRAM memory cell 210_0. When the current sense amplifier circuit 236-i is enabled for a read operating mode, the current sense amplifier circuit 236-i will pre-charge the global bitline RBLi to a pre-charge voltage of about VDD/2. For the read operation, the read wordline RWL0 is asserted to VDD which drives the read access transistor 215 to an ON state. Since the value $\overline{Q}$=0 at node N2 (meaning that the memory cell 210_0 has a logic state of logic Q=1), the read transistor 214 will be in an OFF state. As such, no current path is generated from the read bitline RBLi to ground (VSS) through the read transistors 214 and 215 and, therefore, no read bitline current $I_{RBL}$ flows from the input node of the current sense amplifier circuit 236-i to the read bitline RBLi, i.e., IRBL=0 (except for a small amount of leakage current).

On the other hand, when performing a read operation using the single ended current sense amplifier circuit 236-i when the memory cell 210_0 stores a logic "0" value, wherein Q=0 at node N1, and $\overline{Q}$=1 at node N2 of the SRAM memory cell 210_0. Again, when the current sense amplifier circuit 236-i is enabled for a read operating mode, the current sense amplifier circuit 236-i will pre-charge the global bitline RBL to a pre-charge voltage of about VDD/2. For the read operation, the read wordline RWL0 is asserted to VDD which drives the access transistor 215 to an ON state. Since the value $\overline{Q}=1$ at node N2 (meaning that the memory cell 210_0 has a logic state of logic Q=0), the read transistor 214 will be driven to an ON state. As such, the activation of the read transistors 214 and 215 creates a path from the read bitline RBLi to ground (VSS) through the read transistors 214 and 215, which causes read bitline current $I_{RBL}$ to flow from the input node of the current sense amplifier circuit 236-i on the read bitline RBL, wherein the read bitline current $I_{RBL}$ will be equal to $I_{READ}$ (plus a small amount of leakage current).

In the exemplary embodiment of FIGS. 1, 2 and 3, the single ended current sense amplifier circuits 10, 20 and 22 have one analog bias voltage VB_P with low quiescent current consumption, which is an improvement over prior single ended current sense amplifier. In addition, in some embodiments, the bias circuit uses a switched capacitor scheme.

In an alternative embodiment, the single ended current sense amplifier circuits 10, 20 and 22 may eliminate the bias VB_P and use self-bias by connecting the gate of PMOS transistor MP3 to feedback node FB. This embodiment is basically a derivative of circuit 10 of FIG. 1 but would work with a feedback NOR gate instead of a feedback inverter. This eliminates the remaining bias voltage VB_P by re-using the NBL control voltage as a local bias voltage for PMOS transistor MP3, which requires proper tuning of the MP3 device.

In some embodiments, the single ended current sense includes an amplifier in the form of an inverter which provides the amplified signal from the bitline RBL while bitline RBL provides inputs to the other relevant transistors. The output voltages of the amplifier are set by the transfer curve of the inverter and the input gate voltage which is controlled by SRAM cell and the feedback loop. The feedback is provided by the PMOS transistor MP4. Thus, the feedback loop eliminates the additional biases which are overhead in terms of transistors and difficult to maintain at corner conditions and get affected by device variabilities and cannot track cell voltages. In this case majority of work is done by SRAM cell, which may be an 8T cell as shown in FIG. 4. Thus, tracking is well maintained.

In some embodiments, the operation of the single ended current sense amplifier circuit is to detect if there is a cell read current flowing from the input of the circuit or not. The current input of the single ended current sense amplifier works like the output of a series voltage regulator, since it keeps the voltage of the connected net at a specific voltage. In this case, the voltage is roughly 0.5× VDD and the connected net is the read bitline. During the evaluation window (i.e., the width of the wordline pulse), the read port of an 8T SRAM cell will sink a specific read current if the SRAM cell stores a 1 (READ-1) or no current (only leakage) if the SRAM cell stores a 0 (READ-0). In order to keep the read bitline voltage stable, the input of the single ended current sense amplifier has to have a very low input impedance. A stable bitline voltage is mandatory for a stable, strong read current.

In some prior sense amplifier implementations, a simple source follower was used to define the read bitline voltage, which required a bias voltage that was connected to the gate of the bitline device. The source of the bitline device is the current input of the sense amplifier. In this prior implementation, the input impedance depends on the transconductance, gm, and the small signal output conductance, gds, of the bitline device, which a) requires a fairly large device and b) requires a bias voltage. Bias voltages are costly in terms of power and distribution wiring. In some prior implementations, a current sink device is required to set the correct bias current through the bitline device, and a an NFET device is required to as bleeder to keep the Q node at VSS in the READ-0 case. Those two devices required another bias voltage.

One improvement of the embodiments of the present disclosure is the active feedback from the current sense amplifier input to the gate of NMOS transistor MN3, which has two advantages. First, the input impedance of the sense amplifier input is significantly reduced. This helps the cell read current and therefore improves SNR. Second, the topology is self-biasing, so the bitline bias voltage can be eliminated.

Another improvement of the embodiments of the present disclosure is the elimination of the N bias voltage. In the embodiments disclosed herein, NMOS transistors MN4, MN5 and MN6 are active NFET loads (diode-style connected NFETS) that are used to set the N bias current.

The only remaining required bias voltage is VB_P, that sets the current threshold, that is used to differentiate between a READ-1 current and a READ-0 current. VB_P is connected to the gate of PMOS transistor MP3.

Circuit 10 of FIG. 1 is using a feedback inverter. The inverter is not working as logic gate but as a high gain inverting voltage amplifier. It self-biases itself in the high gain area of the Vin/Vout curve, so that the input of the inverter will be at −0.5× VDD and the output will be about one with higher than 0.5× VDD. If the read bitline voltage should drop, the output of the feedback inverter will rise and open the NMOS transistor MN3 more, allowing more current to flow in order to maintain the read bitline voltage at the steady state voltage. This is strong feedback with a high loop gain, that effectively reduces the input impedance by a factor of >10 compared to the prior implementation. In other word, the bitline voltage will be much better controlled by the sense amp, which improves the read performance significantly.

Circuit 20 of FIG. 2 is basically using the same principle, but here the active feedback element is NOR-alike topology, that allows the introduction of the STBY pin. The prior implementation was lacking a way for at speed power gating. To shut of the sense amps in the prior implementation, all the 3 highly capacitive bias voltages had to be pulled either to VDD or to VSS. The power down and power up phase took >10 clock cycles. Due to the much improved (lowered) impedance of the sense amplifier output, the SDBY pin provides a way to shut down and turn on the sense amplifier within less than a cycle. If STBY is '1', the gate of NMOS transistor MN3 is pulled to VSS, the current through the feedback NOR and MN3 is turned off. At the same time the bleeder circuit formed by NMOS transistors MN13 and MN14 is turned on. In standby mode, the read bitline is not driven/controlled by the sense amplifier. The bleeder devices make sure that the read bitline rather floats down then up. If STBY switches to 1, due to the low input impedance, the sense amplifier is able to re-establish the steady state read bitline voltage within less than 1 clock cycle. The speed clock gating is a huge improvement compared to prior are implementations.

Circuit 22 of FIG. 3 is using the same input stage as circuit 10 of FIG. 1 but adds another current based feedback loop to improve the read speed.

Figure 5:
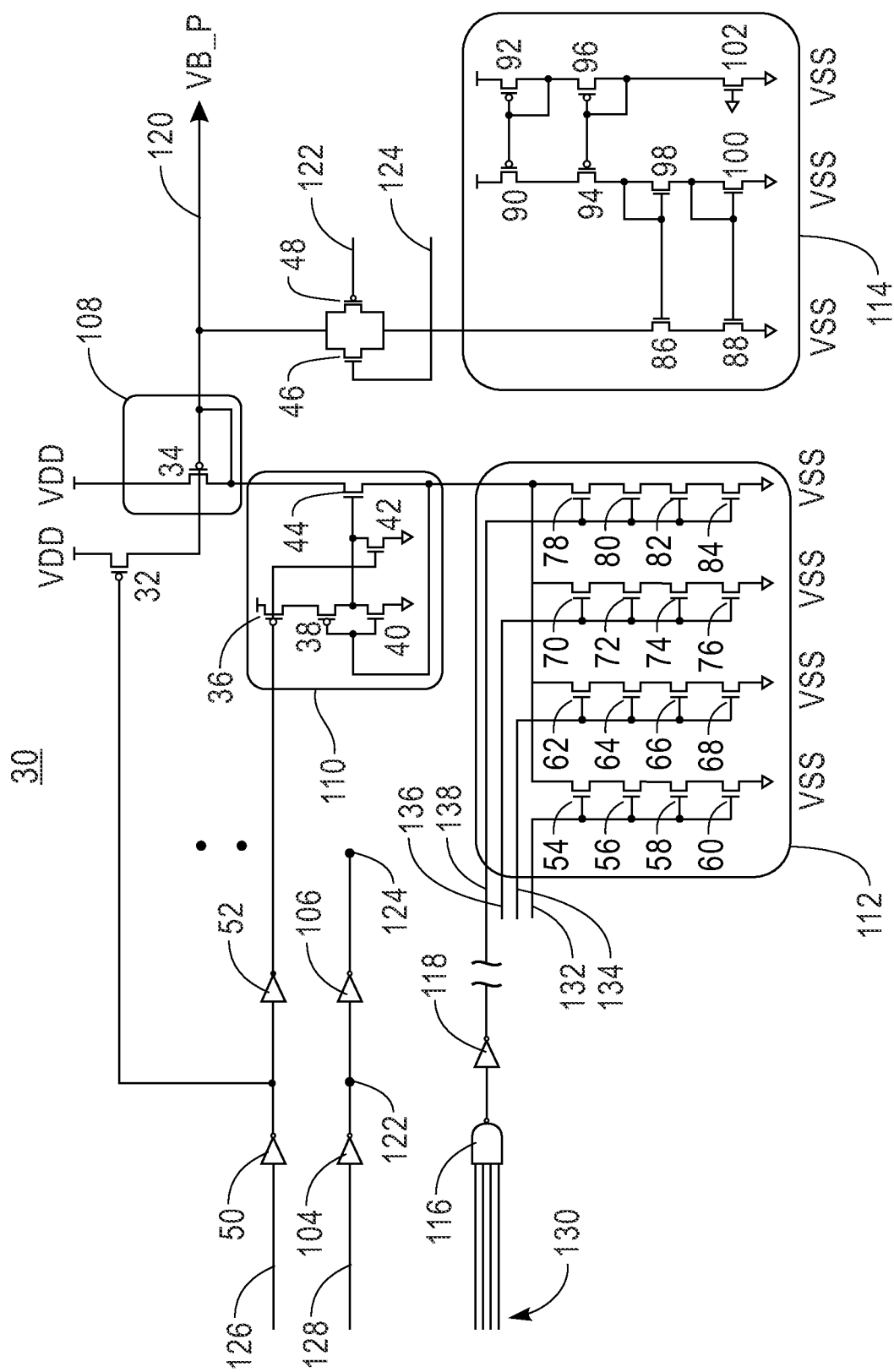
FIG. 5 schematically illustrates a bias generation circuit of a single ended bitline current sense amplifier circuit, according to an exemplary embodiment of the disclosure.

In some embodiments there is provided an additional bias generation circuit. FIG. 5 is an additional bias generation circuit 30 that may be used with any of the circuits of FIGS. 1, 2 and 3. The bias generation circuit 30 includes a PFET 32 having a source terminal connected to VDD, a drain terminal connected to the gate terminal of PFET 34, and a gate terminal connected between an inverter 50 and inverter 52. PFET 34 has a source terminal connected to VDD, a drain terminal connected to the drain of NFET 44, and a gate terminal connected to the drain terminal of NFET 46 and the source terminal of PFET 48. The drain terminal of PFET 34 is shorted to the gate terminal of PFET 34. The gate terminal of PFET 34 is connected at 120 to VB_P of the sense amplifier. The circuit 108 formed by PFET transistor 34 is a reference branch of a current mirror, the counterpart of which is the P bias voltage VB_P in the sense amplifiers 10, 20 and 22.

The bias generation circuit 30 also includes a PFET 36 having a source terminal connected to VDD, a drain terminal connected to the source terminal of PFET 38, and a gate terminal connected to the gate terminal of NFET 42. PFET 38 has a drain terminal connected to the drain terminal of NFET 40 and a gate terminal connected to the source terminal of NFET 44 and to the gate terminal of NFET 40. The source terminal of NFET 40 is connected to VSS. The gate terminal of NFET 44 is connected to the drain terminal of NFET 42 and to the drain terminal of PFET 38. The circuit 110 formed by PFETS 36, 38 and NFETS 40, 42, 44 is an active feedback bitline replica circuit.

The bias generation circuit 30 also includes a NFET 46 having a drain terminal connected to the source terminal of PFET 48, a source terminal connected to the drain terminal of NFET 86, and a gate terminal connected at 124 to the output of inverter 106. The PFET 48 includes a source terminal connected to the drain terminal of PFET 46, a drain terminal connected to the drain terminal of NFET 86, and a gate terminal connected at 122 to the output of inverter 104. The NFET 86 includes source terminal connected to the drain terminal of NFET 88 and a gate terminal connected to the gate terminal of NFET 98. The NFET 88 includes a source terminal connected to VSS and a gate terminal connected to the gate terminal of NFET 100. The PFETs 90 and 94 are connected in series with the source terminal of PFET 90 connected to VDD, the drain terminal of PFET 90 connected to the source terminal of PFET 94 and the gate terminal of PFET 90 connected to the gate terminal of PFET 92 and the gate terminal of PFET 94 connected to the gate terminal of PFET 96. The gate terminals of PFETs 90 and 92 are connected to the drain terminal of PFET 92. The gate terminals of PFETs 94 and 96 are connected to the drain terminal of PFET 96. The drain terminal of PFET 94 is connected to the drain terminal of NFET 98. The NFET 98 includes a gate terminal connected to the gate terminal of NFET 86 and a source terminal connected to the drain terminal of NFET 100. The drain terminal of NFET 98 is shorted to the gate terminals of NFETs 86 and 98. The NFET 100 includes a gate terminal connected to the gate terminal of NFET 88 and a source terminal connected to VSS. The drain terminal of NFET 100 is shorted to the gate terminals of NFETs 88 and 100. The PFET 96 includes a drain terminal connected to the drain terminal of NFET 102. The NFET 102 includes a gate terminal and a source terminal both connected to VSS. The circuit 114 forms a leakage current monitor of the current sense amplifier.

The bias generation circuit 30 also includes a circuit 112 that includes common gate lines 132, 134, 136 and 138. The gate terminals of NFETs 54, 56, 58 and 60 are connected to common gate line 132. The gate terminals of NFETs 62, 64, 66 and 68 are connected to common gate line 134. The gate terminals of NFETs 70, 72, 74 and 76 are connected to common gate line 136. The gate terminals of NFETs 78, 80, 82 and 84 are connected to common gate line 138. The NFETs 54, 56, 58 and 60 are connected in series with the source terminal of NFET 60 connected to VSS and the drain terminal of NFET 54 connected to drain terminal of NFET 78. The NFETs 62, 64, 66 and 68 are connected in series with the source terminal of NFET 68 connected to VSS and the drain terminal of NFET 62 connected to drain terminal of NFET 78. The NFETs 70, 72, 74 and 76 are connected in series with the source terminal of NFET 76 connected to VSS and the drain terminal of NFET 70 connected to drain terminal of NFET 78. The NFETs 78, 80, 82 and 84 are connected in series with the source terminal of NFET 84 connected to VSS and the drain terminal of NFET 78 connected to source terminal of NFET 44.

The bias generation circuit 30 also includes inverters 104 and 106 connected in series. Inverter 50 is connected at 126 to a bias control signal and inverter 104 is connected at 128 to a bias control signal. In one embodiment control signal 126 may be a config-bit enable signal and control signal 128 may be an inverted config-bit enable signal. The control signal 126 controls the operation of the active feedback replica circuit 110. The control signal 128 controls the operation of NFET 46 and PFET 48 which serve as a bias adjuster by providing a leakage current path when necessary. The bias generation circuit 30 also includes DC control logic signals 130 that are input to NOR gate 116. The output Qt of NOR gate 116 is input to inverter 118.

As described above, the single ended current sense amplifier circuits of FIGS. 1, 2 and 3 are using the bias voltage VB_P to set the threshold current Ith. In some embodiments, the bias voltage generator circuit 30, that generates VB_P, is designed to automatically adjust to manufacturing process variations. The bias generator circuit 30 uses the read bitline replica circuit 110 and has the same feedback topology as the sense amplifier itself to generate a reference current that tracks with the read current of an 8T SRAM cell. The reference current is generated by an NMOS transistor stack circuit 112, that is controlled by the four config_bias control signals 130. The four signals 130 are output from inverter 118 to nodes 132, 134, 136 and 138 of the transistor stack 112. Additionally, the leakage monitor circuit 114, that generates about the same amount of leakage as one complete read bitline complex with all the connected SRAM cells would generate, adds a certain margin to the reference current to compensate for process variations that would cause excessive leakage. A fraction of this reference current (which serves as the threshold current) is mirrored to the PBIAS PMOS transistor MP3 in the sense amplifier by VB_P (PMOS transistor in the bias generator and the PMOS transistor in sense amplifier from the current mirror 108, reference branch 34 is in the bias generator circuit, the other branch is in the sense amplifier. The reference current is programmable by selection of one of the five differently tuned devices.

Figure 6:
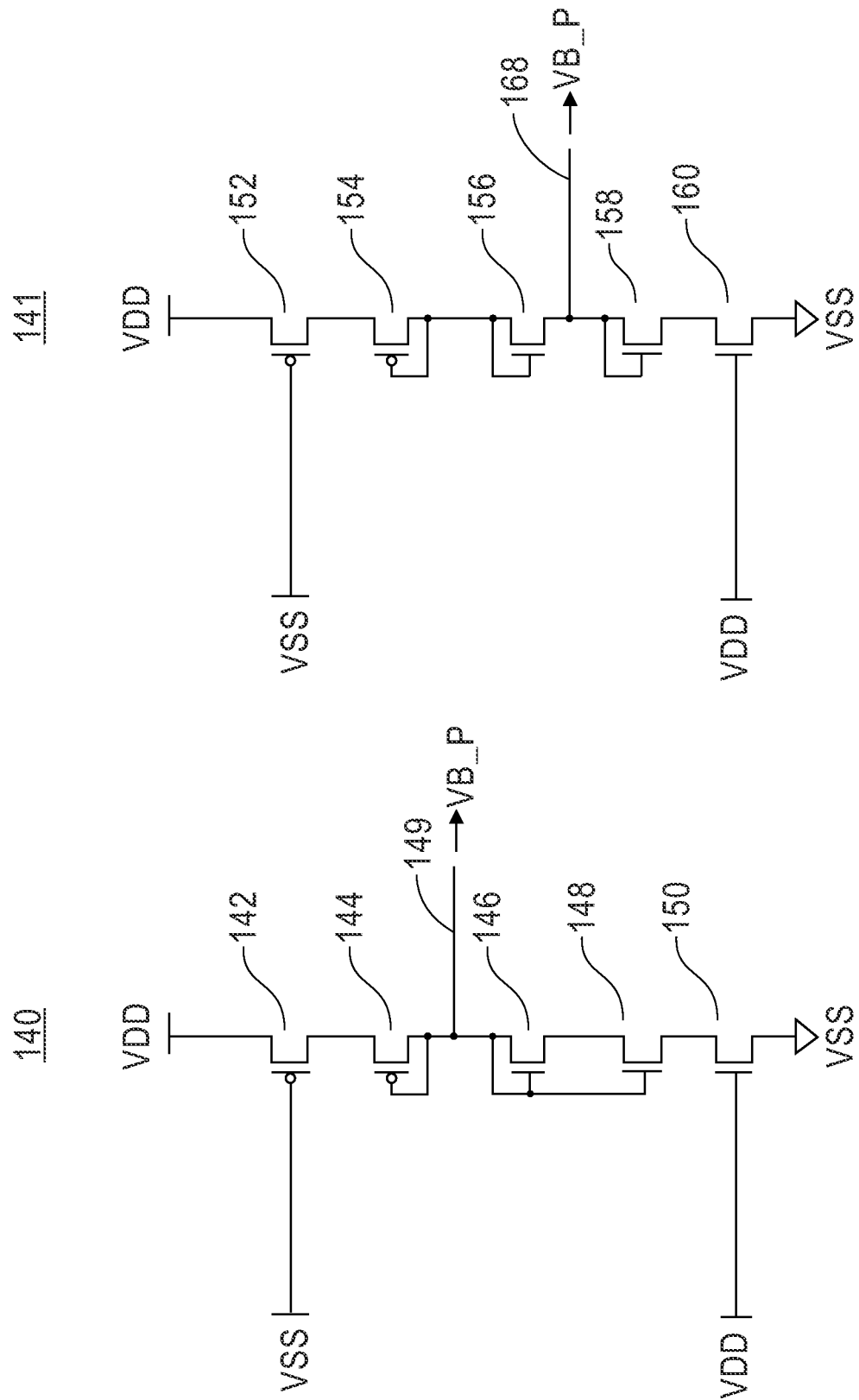
FIG. 6A schematically illustrates a bias generation circuit of a single ended bitline current sense amplifier circuit, according to an exemplary embodiment of the disclosure.
FIG. 6B schematically illustrates a bias generation circuit of a single ended bitline current sense amplifier circuit, according to an exemplary embodiment of the disclosure.

FIGS. 6A and 6B schematically illustrates alternative embodiments of bias generation circuits 140 and 141 that may provide the bias signal VB_P of the single ended current sense amplifier 22 of FIG. 3. The bias generation circuit 140 of FIG. 6A is a dual self-bias circuit that includes PFETs 142, 144 and NFETs 146, 148 and 150 connected in series with the source terminal of PFET 142 connected to VDD and the source terminal of NFET 150 connected to VSS. The gate terminal of PFET 142 is connected to VSS of the sense amplifier 22. The gate terminal of NFET 150 is connected at 147 to VDD of the sense amplifier 22. The gate terminals of PFET 144, NFET 146 and NFET 148 are connected to the drain terminal of PFET 144 and the drain terminal of NFET 146, which is connected at 149 to VB_P of the sense amplifier 22.

The bias generation circuit 141 of FIG. 6B is a dual self-bias circuit that includes PFETs 152, 154 and NFETs 156, 158 and 160 connected in series with the source terminal of PFET 152 connected to VDD through device 178 and the source terminal of NFET 160 connected to VSS. The gate terminal of PFET 152 is connected to VSS of the sense amplifier 22. The gate of PFET 154 is shorted to its drain terminal. The gate of NFET 156 is shorted to its drain terminal. The gate of NFET 158 is shorted to its drain terminal. The drain terminal of NFET 158 and the source terminal of NFET 156 are connected at 168 to VB_P of the sense amplifier 22. The gate terminal of NFET 160 is connected to VDD of the sense amplifier 22.

It is to be understood that exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

Figure 7:
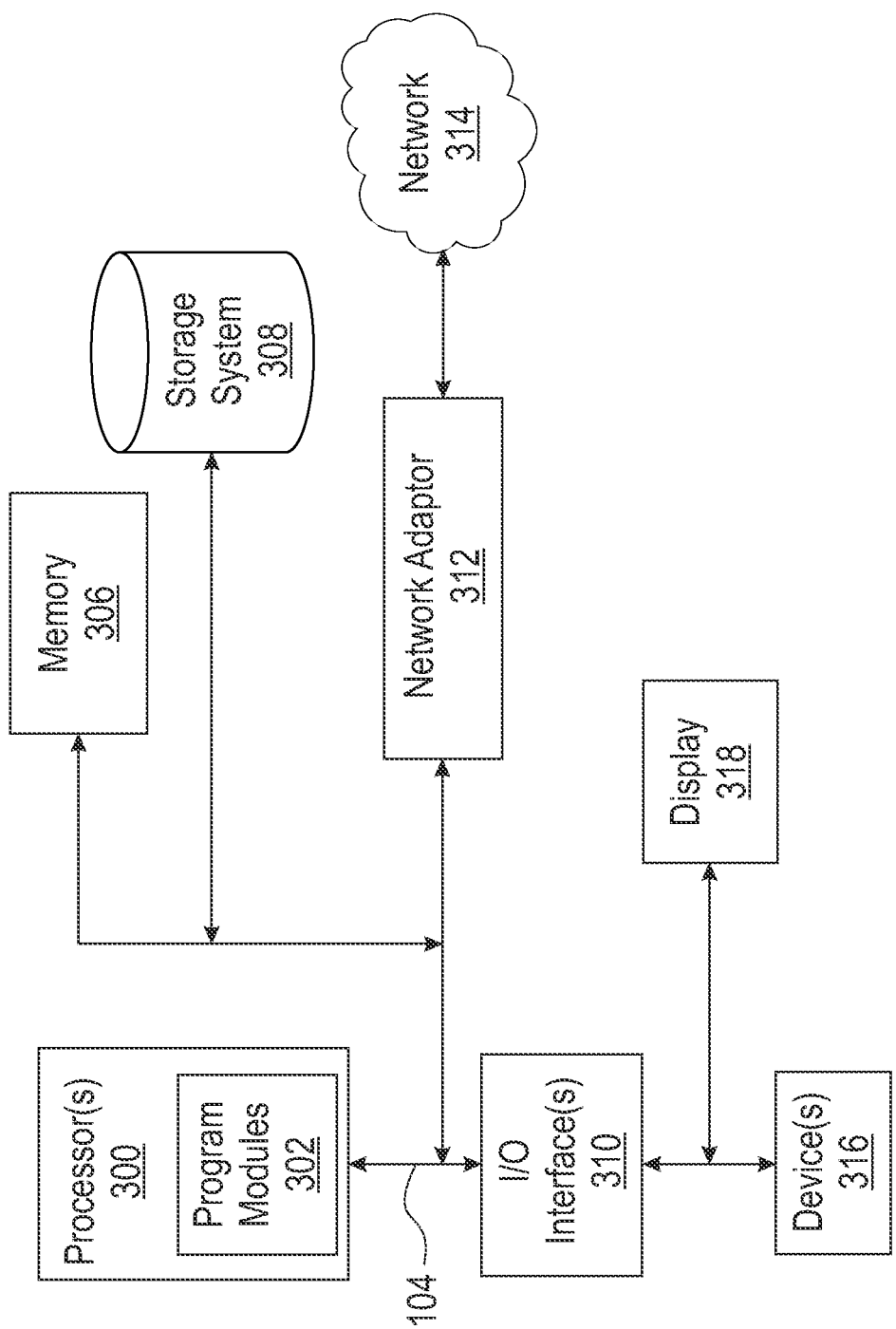
FIG. 7 is a block diagram of an exemplary computing system suitable for implementation of the exemplary embodiments of the disclosure.

FIG. 7 illustrates a schematic of an example computer or processing system that may implement exemplary embodiments of the single ended current sense amplifier of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 300, a system memory 306, and a bus 304 that couples various system components including system memory 306 to processor 300. The processor 300 may include a program module 302 that performs the methods described herein. The module 302 may be programmed into the integrated circuits of the processor 300, or loaded from memory 106, storage device 308, or network 314 or combinations thereof.

Bus 304 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 306 can include computer system readable media in the form of volatile memory, such as random access memory (RAM) and/or cache memory or others. Computer system may further include other removable/non-removable, volatile/non-volatile computer system storage media. By way of example only, storage system 308 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

Computer system may also communicate with one or more external devices 316 such as a keyboard, a pointing device, a display 318, etc.; one or more devices that enable a user to interact with computer system; and/or any devices (e.g., network card, modem, etc.) that enable computer system to communicate with one or more other computing devices. Such communication can occur via Input/Output (I/O) interfaces 310.

Still yet, computer system can communicate with one or more networks 314 such as a local area network (LAN), a general wide area network (WAN), and/or a public network (e.g., the Internet) via network adapter 312. As depicted, network adapter 312 communicates with the other components of computer system via bus 304. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Figure 8:
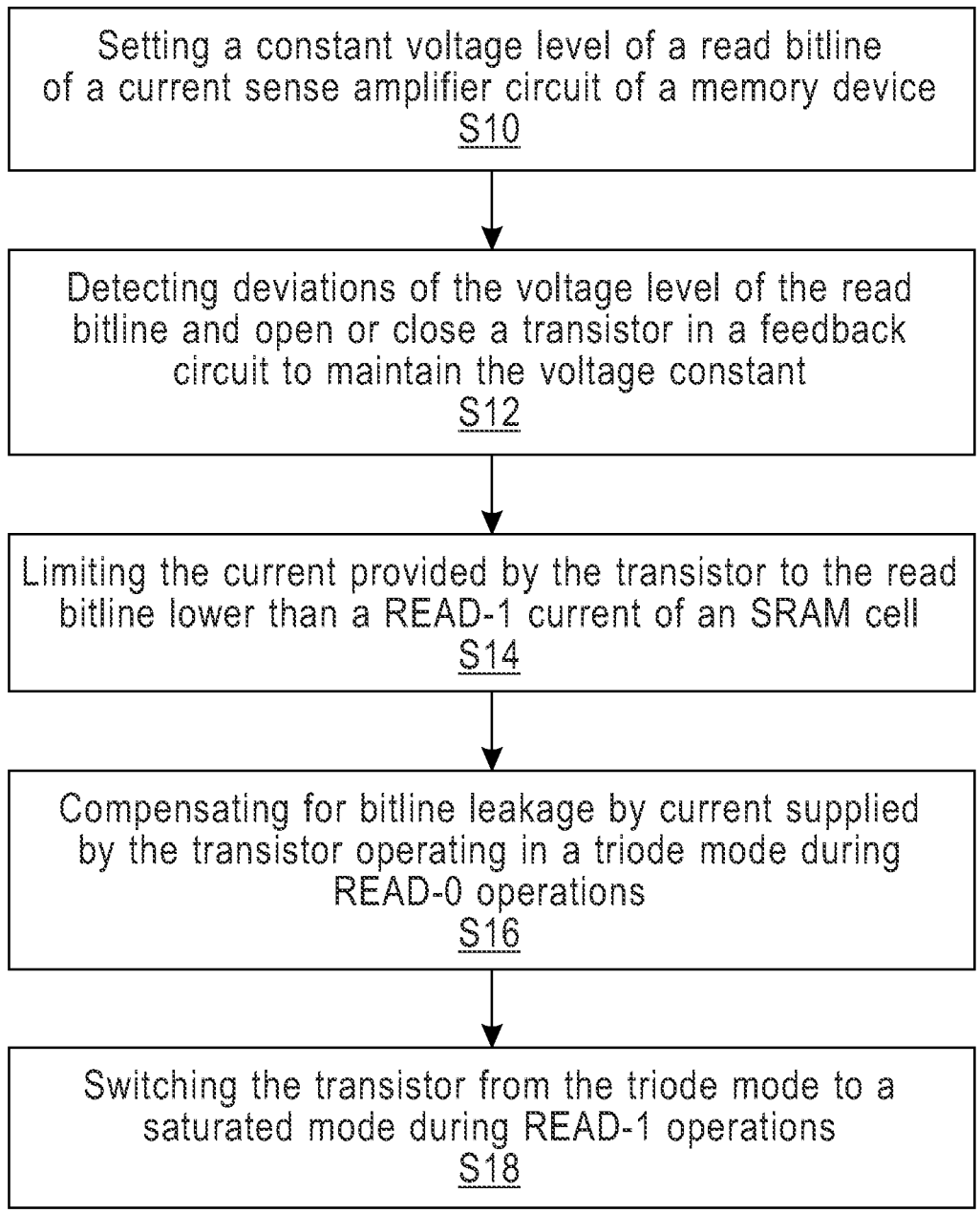
FIG. 8 is a flow diagram of a method according to an exemplary embodiment of the disclosure.

FIG. 8 is a flow diagram of one embodiment of a method comprising step S10 of setting a constant voltage level of a read bitline of a current sense amplifier circuit of a memory device and step S12 of detecting deviations of the voltage level of the read bitline and open or close a transistor in a feedback circuit to maintain the voltage constant. In one embodiment, the transistor is connected between a bitline node and a current sense node of the current sense amplifier circuit. The method may also include step S14 of limiting the current provided by the transistor to the read bitline lower than a READ-1 current of an SRAM cell. The method may also include step S16 of compensating for bitline leakage by current supplied by the transistor operating in a triode mode during READ-0 operations of the memory device and step SD18 of switching the transistor from the triode mode to a saturated mode during READ-1 operations of the memory device.

In addition, while preferred embodiments of the present invention have been described using specific terms, such description is for illustrative purposes only, and it is to be understood that changes and variations may be made without departing from the spirit or scope of the following claims.

What is claimed is:

1. A sense amplifier circuit comprising:
   a read bitline node;
   a sense node; and
   a feedback circuit comprising a feedback inverter connected between the read bitline node and the sense node, the feedback inverter comprising:
     first and second NMOS transistors serially connected to a feedback node and first and second PMOS transistors serially connected to the feedback node;
     a third NMOS transistor having a gate terminal connected to the feedback node, a drain terminal connected to the sense node and a source terminal connected to the read bitline node;
     a third PMOS transistor having a gate terminal connected to a bias signal a source terminal connected to VDD and a drain terminal connected to the sense node; and
     a fourth PMOS transistor having a gate terminal connected to sense node and a drain terminal connected to the read bitline node;
   wherein the fourth PMOS transistor provides a feedback current path to the read bitline node.

2. The sense amplifier circuit of claim 1, wherein the feedback circuit is configured to detect deviations in voltage at the read bitline node and control the third NMOS transistor to regulate the voltage at the read bitline node.

3. The sense amplifier circuit of claim 2, wherein the fourth PMOS transistor is a common source amplifier configured to drive gate terminals of a plurality of stacked NMOS transistors configured to set the read bitline bias voltage.

4. The sense amplifier circuit of claim 2, wherein the feedback circuit comprises a fifth PMOS transistor having a gate terminal connected to the sense node and a drain terminal connected to the read bitline node and being configured to provide another current sensing path of the feedback circuit.

5. The sense amplifier circuit of claim 4, wherein the feedback circuit comprises a seventh NMOS transistor having a drain terminal connected to the drain of the fourth PMOS transistor, wherein seventh NMOS transistor is configured to act as a current mirror and the fourth PMOS transistor drives the gate of the seventh NMOS transistor.

6. The sense amplifier circuit of claim 1, wherein the feedback circuit comprises a fourth NMOS transistor having a drain terminal connected to the feedback node and gate terminal serving as a first standby pin.

7. The sense amplifier circuit of claim 6, wherein the feedback circuit comprises fifth and sixth NMOS transistors serially connected between the read bitline node and VSS, wherein the gate terminal of the sixth transistor serves as a second standby pin, the fifth and sixth NMOS transistors being configured to provide leakage control.

8. The sense amplifier circuit of claim 1, wherein the feedback circuit comprises a third PMOS transistor having a gate terminal connected to the feedback node, a source terminal connected to VDD and a drain terminal connected to the sense node.

9. A sense amplifier circuit comprising:
   a read bitline node;
   a sense node;
   a feedback circuit comprising a feedback inverter configured to regulate voltage on the read bitline node; and
   a bias generation circuit comprising a read bitline replica circuit and a current mirror circuit.

10. The sense amplifier circuit of claim 9, wherein the bias generation circuit comprises a leakage monitor circuit and a plurality of stacked NMOS transistors.

11. A memory device, comprising:
   an array of memory cells;
   first control lines extending in a first direction across the array of memory cells and second control lines extending in a second direction across the array of memory cells, wherein the second control lines comprise a plurality of read bitlines;
   control circuitry coupled to the first control lines and to the second control lines, wherein the control circuitry comprises singled ended read bitline current sense amplifier circuitry coupled to the plurality of read bitlines, wherein the singled ended read bitline current sense amplifier circuitry comprises at least one sense amplifier circuit connected to a given read bitline, wherein the at least one sense amplifier circuit comprises:
     a read bitline node;
     a sense node; and
     a feedback circuit comprising a feedback inverter connected between the read bitline node and the sense node, the feedback inverter comprising:
       first and second NMOS transistors serially connected to a feedback node and first and second PMOS transistors serially connected to the feedback node;
       a third NMOS transistor having a gate terminal connected to the feedback node, a drain terminal connected to the sense node and a source terminal connected to the read bitline node;
       a third PMOS transistor having a gate terminal connected to a bias signal a source terminal connected to VDD and a drain terminal connected to the sense node; and a fourth PMOS transistor having a gate terminal connected to sense node and a drain terminal connected to the read bitline node;
wherein the fourth PMOS transistor provides a feedback current path to the read bitline node.

12. The memory device of claim 11, wherein,
the fourth PMOS transistor is a common source amplifier configured to drive gate terminals of a plurality of stacked NMOS transistors configured to set the read bitline bias voltage and wherein the feedback circuit is configured to detect deviations in voltage at the read bitline node and control the third NMOS transistor to regulate the voltage at the read bitline node.

13. The memory device of claim 12, wherein the feedback circuit comprises:
a fourth NMOS transistor having a drain terminal connected to the feedback node and gate terminal serving as a first standby pin; and fifth and sixth NMOS transistors serially connected between the read bitline node and VSS, wherein the gate terminal of the sixth transistor serves as a second standby pin.

14. The memory device of claim 12, wherein the feedback circuit comprises:
a fifth PMOS transistor having a gate terminal connected to the sense node and a drain terminal connected to the read bitline node and being configured to provide another current sensing path of the feedback circuit; and
a seventh NMOS transistor having a drain terminal connected to the drain of the fourth PMOS transistor, wherein seventh NMOS transistor is configured to act as a current mirror and the fourth PMOS transistor drives the gate of the seventh NMOS transistor.

15. The memory device of claim 11, further comprising a bias generation circuit comprising a read bitline replica circuit and a current mirror circuit, wherein the bias generation circuit comprises a leakage monitor circuit and a plurality of stacked NMOS transistors.

16. A method comprising:
setting a constant voltage level of a read bitline of a current sense amplifier circuit of a memory device, the current sense amplifier circuit comprising:
a read bitline node;
a sense node; and
a feedback circuit comprising a feedback inverter connected between the read bitline node and the sense node, the feedback converter comprising:
first and second NMOS transistors serially connected to a feedback node and first and second PMOS transistors serially connected to the feedback node;
a third NMOS transistor having a gate terminal connected to the feedback node, a drain terminal connected to the sense node and a source terminal connected to the read bitline node;
a third PMOS transistor having a gate terminal connected to a bias signal a source terminal connected to VDD and a drain terminal connected to the sense node; and
a fourth PMOS transistor having a gate terminal connected to sense node and a drain terminal connected to the read bitline node;
detecting deviations of the voltage level of the read bitline; and
opening or closing the third NMOS transistor to maintain the voltage constant.

17. The method of claim 16, further comprising limiting the current provided by the third PMOS transistor to the read bitline lower than a READ-1 current of an SRAM cell, compensating for read bitline leakage by current supplied by the third PMOS transistor operating in a triode mode during READ-0 operations of the memory device and switching the third PMOS transistor from the triode mode to a saturated mode during READ-1 operations of the memory device.

* * * * *